United States Patent
Song

(10) Patent No.: US 8,341,477 B2
(45) Date of Patent: Dec. 25, 2012

(54) TEST BOARD HAVING A PLURALITY OF TEST MODULES AND A TEST SYSTEM HAVING THE SAME

(75) Inventor: Won-Hyung Song, Hwaseong-si (KR)

(73) Assignee: Samsung Electronics Co., Ltd., Suwon-Si (KR)

(*) Notice: Subject to any disclaimer, the term of this patent is extended or adjusted under 35 U.S.C. 154(b) by 351 days.

(21) Appl. No.: 12/722,270

(22) Filed: Mar. 11, 2010

(65) Prior Publication Data

US 2010/0235700 A1    Sep. 16, 2010

(30) Foreign Application Priority Data

Mar. 13, 2009  (KR) .................. 10-2009-0021717

(51) Int. Cl.
G01R 31/28 (2006.01)
G01R 27/28 (2006.01)
G01R 31/00 (2006.01)
G01R 31/14 (2006.01)
G06F 11/00 (2006.01)
G06F 19/00 (2006.01)

(52) U.S. Cl. ........ 714/744; 714/724; 714/731; 702/117; 702/125

(58) Field of Classification Search .................. None
See application file for complete search history.

(56) References Cited

U.S. PATENT DOCUMENTS

| | | | | |
|---|---|---|---|---|
| 6,115,763 | A * | 9/2000 | Douskey et al. | 710/72 |
| 6,671,844 | B1 * | 12/2003 | Krech et al. | 714/736 |
| 6,834,364 | B2 * | 12/2004 | Krech et al. | 714/45 |
| 6,894,308 | B2 * | 5/2005 | Whetsel et al. | 257/48 |
| 7,380,186 | B2 * | 5/2008 | Schuttert et al. | 714/727 |
| 7,529,994 | B2 * | 5/2009 | Shinohara et al. | 714/727 |
| 7,954,017 | B2 * | 5/2011 | Kashyap et al. | 714/718 |
| 8,108,744 | B2 * | 1/2012 | Dubey et al. | 714/733 |
| 2005/0283681 | A1 * | 12/2005 | Jeddeloh | 714/42 |
| 2007/0198881 | A1 | 8/2007 | Volkerink et al. | |
| 2007/0226591 | A1 * | 9/2007 | Proell et al. | 714/763 |
| 2008/0086664 | A1 | 4/2008 | Behziz et al. | |
| 2008/0126892 | A1 * | 5/2008 | Dubey et al. | 714/718 |
| 2008/0133165 | A1 * | 6/2008 | Iwamoto et al. | 702/118 |
| 2010/0005366 | A1 * | 1/2010 | Dell et al. | 714/758 |

FOREIGN PATENT DOCUMENTS

| | | |
|---|---|---|
| KR | 1020010104719 | 11/2001 |
| KR | 1020050039827 | 4/2005 |
| KR | 1020070029654 | 3/2007 |

* cited by examiner

*Primary Examiner* — Guerrier Merant
(74) *Attorney, Agent, or Firm* — F. Chau & Associates, LLC

(57) ABSTRACT

A test board includes a plurality of test modules. Each test module stores a first control signal, a data signal, and a second control signal in response to a clock signal, and tests a corresponding device under test (DUT) using the first control signal and the stored data signal in response to the second control signal to generate an error signal indicating whether the DUT is defective. Each test module outputs the first control signal, the data signal, and the second control signal to a test module in a next stage, and each test module of a subsequent stage receives the error signal stored generated by a test module in a previous stage in response to the clock signal.

20 Claims, 4 Drawing Sheets

TEST BOARD HAVING A PLURALITY OF TEST MODULES AND A TEST SYSTEM HAVING THE SAME

CROSS-REFERENCE TO RELATED APPLICATION

This application claims priority under 35 U.S.C. §119 to Korean Patent Application No. 10-2009-0021717, filed on Mar. 13, 2009, the disclosure of which is incorporated by reference in its entirety herein.

BACKGROUND

1. Technical Field

Exemplary embodiments of the inventive concept relate to a test board, and more particularly, to a test board including a plurality of test modules and a test system having the same.

2. Discussion of Related Art

In a general performance test of semiconductor devices, a test apparatus may be used to determine whether defects have occurred during a manufacturing process, before the finalized semiconductor devices are delivered to users. The more semiconductor devices that can be tested at one time, the more efficient the test.

Since semiconductor devices may operate at high speeds, a test apparatus may also need to operate at high speeds. A large number of semiconductor devices may be tested at one time when a test apparatus includes a large number of channels. However, when a test apparatus operates at a high speed, the cost per channel may be extremely high.

Thus, there is a need for a test apparatus that can operate at high speeds to test many semiconductor devices with a reduced cost.

SUMMARY

According to an exemplary embodiment of the inventive concept, a test board includes a plurality of test modules. Each test module stores a first control signal, a data signal, and a second control signal in response to a clock signal, tests a corresponding device under test (DUT) using the first control signal and the data signal in response to the second control signal to generate an error judgment signal indicating whether the DUT is defective. Each test module outputs the first control signal, the data signal, and the second control signal to a test module in a next stage, and each test module of a subsequent stage receives the error judgment signal generated by a test module in a previous stage in response to the clock signal.

Each test module of a subsequent stage may receive the error judgment signal generated by a test module in a previous stage in response to the clock signal when all of the tests of the test modules have completed. The plurality of test modules may be connected in series with one another and the last test module of the series may output the error judgment signal to the test board.

Each test module may include a clock generator configured to output an internal clock signal in response to the clock signal, a latch unit configured to receive and store the first control signal, the data signal, and the second control signal in response to the internal clock signal, and output the first control signal, the data signal, and the second control signal which are stored therein, and an error detector configured to output the data signal output from the latch unit to the corresponding DUT in response to the second control signal, compare a data signal output from the DUT with the data signal output from the latch unit in response to the internal clock signal and the second control signal, and test the DUT using the comparison result to output the error judgment signal.

Each test module may further include an error display configured to display whether the corresponding DUT is defective in response to the error judgment signal.

The clock generator may output first to fourth internal clock signals in response to the clock signal. The second control signal may include a data path control signal, a comparison timing signal, and an error output signal. The latch unit may include a first latch configured to receive and store the first control signal in response to the first internal clock signal, and output the stored first control signal to the corresponding DUT and the test module in the next stage, a second latch configured to receive and store the data signal in response to the second internal clock signal, and output the stored data signal to the error detector and the test module in the next stage, a third latch configured to receive and store the data path control signal in response to the third internal clock signal, and output the stored data path control signal to the error detector and the test module in the next stage, and a fourth latch configured to receive and store the comparison timing signal in response to the fourth internal clock signal, and output the stored comparison timing signal to the error detector and the test module in the next stage. The error output signal may be applied to the error detector and the test module in the next stage without passing through a latch.

The error detector may include a buffer configured to output the data signal output from the second latch to the corresponding DUT in response to the data path control signal, a comparing section configured to compare the data signal output from the second latch with a data signal output from the DUT to determine whether the DUT is defective, and output the comparison result in response to the comparison timing signal, and an error storing section configured to receive and store the output signal of the comparing section or the error judgment signal of the test module in the previous stage in response to the error output signal, and output the stored signal as the error judgment signal.

The comparing section may include an exclusive OX (XOR) gate configured to receive the data signal output from the second latch and the data signal output from the corresponding DUT to perform an XOR operation, and a first multiplexer configured to select and output one signal between a signal of logic "0" and an output signal of the XOR gate in response to the comparison timing signal.

The clock generator may additionally output a fifth internal clock signal in response to the clock signal. The error storing section may include an OR gate configured to perform an OR operation on the output signal of the comparing section and the error judgment signal to output the operation result, a second multiplexer configured to select and output one signal between the output signal of the OR gate in response to the error output signal and the error judgment signal output from the test module in the previous stage, and an error latch configured to receive and store the output signal of the second multiplexer in response to the fifth internal clock signal, and output the stored signal as the error judgment signal.

A test system according to an exemplary embodiment of the inventive concept includes a test apparatus configured to output a first control signal, a data signal, a second control signal, and a clock signal, and a test board having a plurality of test modules. Each test module receives and stores a first control signal, a data signal, and a second control signal in response to a clock signal, and tests a corresponding device under test (DUT) using the stored first control signal and the stored data signal in response to the stored second control signal to store an error judgment signal indicating whether the DUT is defective. Each test module outputs the first control signal, the data signal, and the second control signal, which are stored therein, to a test module in a next stage, and receives and stores the error judgment signal output from a test module in a previous stage in response to the clock signal when all of the tests of the test modules have completed. The first test module of the test modules receives the first control signal, the data signal, the second control signal, and the clock signal output from the test apparatus, and the last test module of the test modules outputs the error judgment signal to the test apparatus. The plurality of test modules may be connected in series with one another.

Each test module may include a clock generator configured to output an internal clock signal in response to the clock signal, a latch unit configured to receive and store the first control signal, the data signal, and the second control signal in response to the internal clock signal, and output the first control signal, the data signal, and the second control signal which are stored therein, and an error detector configured to output the data signal output from the latch unit to the corresponding DUT in response to the second control signal, compare a data signal output from the DUT with the data signal output from the latch unit in response to the internal clock signal and the second control signal, test the DUT using the comparison result, and store and output the error judgment signal.

Each test module may additionally include an error display configured to display whether the corresponding DUT is defective in response to the error judgment signal.

According to an exemplary embodiment of the inventive concept, a test system includes a test apparatus and a plurality of test modules. The test apparatus is configured to output a first control signal, a second control signal, a data signal, and a clock signal. Each test module is configured to interface with and test a different device under test (DUT). Each test module stores the first control signal, the second control signal, and the data signal in response to the clock signal and tests a corresponding DUT using the data signal and the first control signal in response to the second control signal to generate an error signal indicating whether the DUT is defective. The test board sequentially outputs the error signals to the test apparatus based on a state of the second control signal.

The test board may be configured such that either the clock signal is output from the test apparatus to each of the test modules or the clock signal is output from the test apparatus only to the first test module and each subsequent test module receives the clock signal from a prior test module.

The plurality of test modules may be connected in series with one another. The test board sequentially outputs the error signals via the last test module. At least one of the test modules may each include a multiplexor that receives a result of the test and the error signal of a preceding test module and outputs one of the result or the error signal to a subsequent test module based on the second control signal. At least one of the test modules may include a clock generator configured to output an internal clock signal in response to the clock signal, a latch unit configured to store the first control signal, the data signal, and the second control signal in response to the internal clock signal, and an error detector configured to output the data signal output from the latch unit to the corresponding DUT in response to the second control signal, compare a data signal output from the DUT with the data signal output from the latch unit in response to the internal clock signal and the second control signal, and test the DUT using the comparison result to output the error signal.

The error detector may include a buffer configured to output the data signal output from the latch unit to the corresponding DUT in response to the second control signal, a comparing section configured to compare the data signal output from the latch unit with a data signal output from the DUT to determine whether the DUT is defective, and output the comparison result in response to the second control signal, and an error storing section configured to receive and store the output signal of the comparing section or the error signal of the test module of the previous stage in response to the second control signal. The comparing section may include an exclusive OX (XOR) gate configured to receive the data signal output from the latch unit and the data signal output from the corresponding DUT to perform an XOR operation, and a multiplexer configured to select and output one of a predefined logic level and an output signal of the XOR gate in response to the second control signal.

BRIEF DESCRIPTION OF THE DRAWINGS

Exemplary embodiments of the inventive concept are described in further detail below with reference to the accompanying drawings.

DETAILED DESCRIPTION OF THE EMBODIMENTS

The inventive concept will now be described more fully with reference to the accompanying drawings in which exemplary embodiments thereof are shown. However, the inventive concept may be embodied in many alternate forms and should not be construed as limited to only the exemplary embodiments set forth herein.

Figure 1:
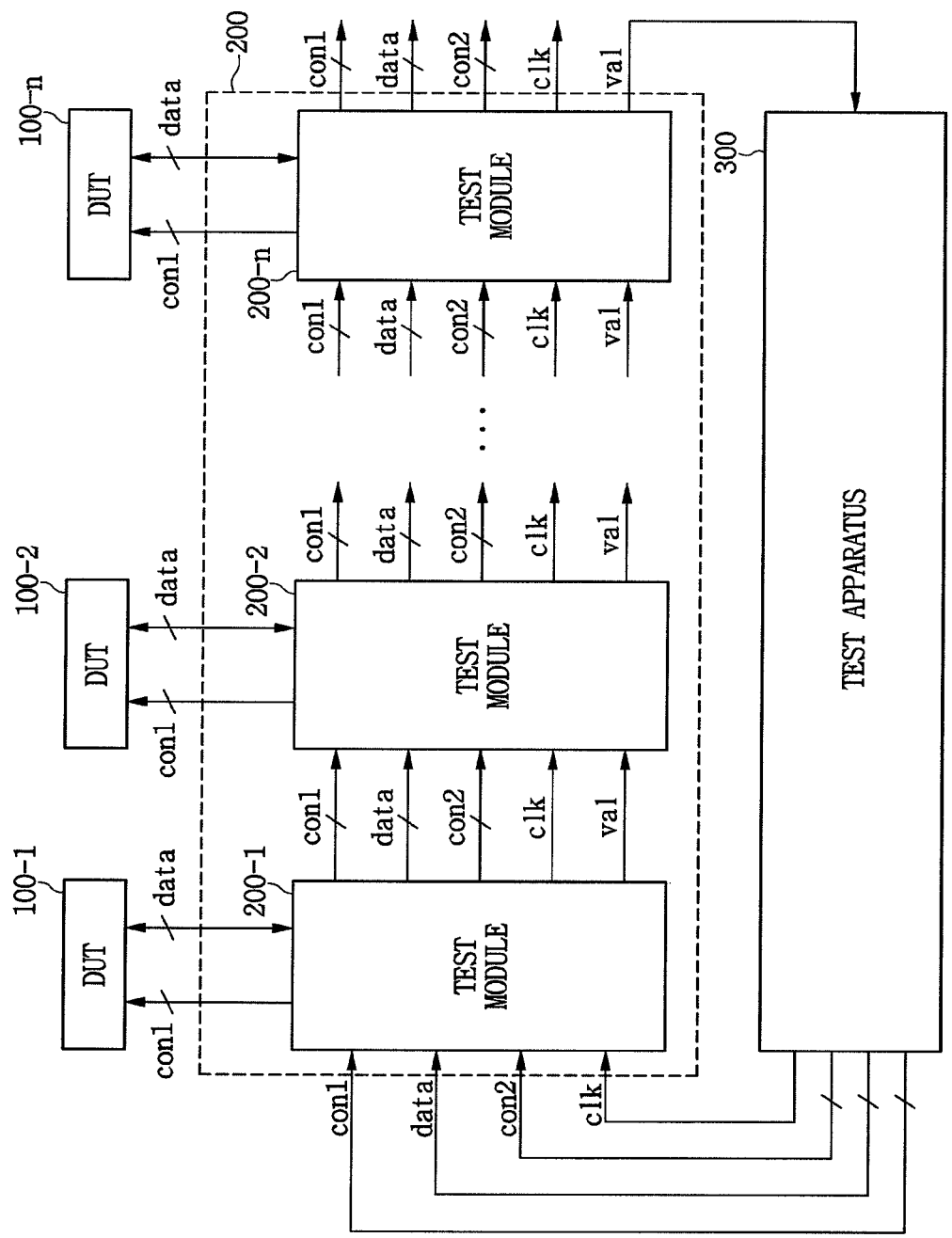
FIG. 1 is a diagram of a test system having a test board according to exemplary embodiment of the inventive concept.

FIG. 1 is a diagram of a test system having a test board 200 according to an exemplary embodiment of the inventive concept. The test system may include a plurality of devices under test (DUTs) 100-1 to 100-n, the test board 200, and a test apparatus 300. In at least one exemplary embodiment of the inventive concept, the test board 200 includes a plurality of test modules 200-1 to 200-n connected in series.

Each of the DUTs 100-1 to 100-n operates in response to a first control signal con1. For example, when a DUT is a semiconductor memory device, the first control signal con1 may include read/write commands, an address signal, etc. The semiconductor memory device receives and stores data or outputs the stored data in response to the first control signal con1. Another semiconductor device, for example a device under test other than the semiconductor memory device, may output predetermined data depending on an operation result.

The test board 200 may include the test modules 200-1 to 200-n. The test modules 200-1 to 200-n output the first control signal con1 or the first control signal con1 and a data signal data to the DUTs 100-1 to 100-n, respectively in response to a second control signal con2 and a clock signal clk, and output the first control signal con1, the second control signal con2, the data signal data, and an error judgment signal val. Each of the test modules 200-1 to 200-*n* may be implemented as one integrated circuit (IC) which can individually operate. The number of the test modules 200-1 to 200-*n* included within the test board 200 may be set to the same value as the desired number of DUTs which are to be tested at one time.

The first test module 200-1 may receive the first control signal con1, the data signal data, the second control signal con2, and the clock signal clk, which are output from the test apparatus 300. Each of the other test modules 200-2 to 200-*n* may receive the first control signal con1, the data signal data, the second control con2, the clock signal clk, and the error judgment signal val, which are output from a test module of a previous stage. The first test module 200-1 may be configured to receive a signal corresponding to logic "0" (or logic "1") instead of the error judgment signal val of the test module of the previous stage.

Each of the test modules 200-1 to 200-(n−1) may output the first control signal con1, the data signal data, the second control signal con2, the clock signal clk, and the error judgment signal val to a test module of a next stage, and the last test module 200-*n* may output the error judgment signal val to the test apparatus 300.

FIG. 1 shows an example where the clock signal clk output from the test apparatus 300 is input to the test module 200-1 and then consecutively input to the other test modules 200-2 to 200-*n*. However, the clock signal clk may be directly applied from the test apparatus 200-1 to the test modules 200-1 to 200-*n*, respectively, through one signal line or a plurality of signal lines.

The test apparatus 300 outputs the first control signal con1, the second control signal con2, the data signal data, and the clock signal clk to the test board 200. The first control signal con1 is used for controlling the DUTs 100-1 to 100-*n*, the second control signal con2 is used for controlling the test modules 200-1 to 200-*n*, and the data signal data is used for judging whether the DUTs 100-1 to 100-*n* are normal or not (e.g., defective). The test apparatus 300 receives the error judgment signal val output from the test board 200 and then judges whether each of the DUTs 100-1 to 100-*n* is normal or not (e.g., defective).

The test apparatus 300 may output a first control signal con1 and a data signal data in the same manner as it tests one DUT, and outputs a second control signal con2 for controlling the test modules and a clock signal clk.

Each of the test modules 200-1 to 200-*n* of the test board 200 may store the first control signal con1, the second control signal con2, and the data signal data in response to the clock signal clk. Then, the test module outputs the stored first control signal con1 (and the stored data signal data) to a DUT in response to the clock signal clk, and then outputs the first control signal con1, the second control signal con2, and the data signal data to a test module in the next stage. Then, the test module compares a data signal data output from the DUT with the stored data signal data in response to the second control signal con2, and judges whether the DUT is normal or not (e.g., defective). Further, the test module generates and stores an error judgment signal val indicating the judgment result. Next, the test module outputs the error judgment signal val in response to the second control signal con2.

When the test apparatus 300 outputs the first control signal con1, the second control signal con2, and the data signal data to the test module 200-1 of the test board 200, the test module 200-1 may store the first control signal con1, the second control signal con2, and the data signal data in response to the clock signal clk.

Next, the test module 200-1 outputs the stored first control signal con1 and the stored data signal data to the DUT 100-1 in response to the clock signal clk, and then judges whether the DUT 100-1 is normal or not (e.g. defective) in response to the stored second control signal con2, using the stored data signal data and a data signal data output from the DUT 100-1. Further, the test module 200-1 generates and stores an error judgment signal val indicating whether the DUT 100-1 is normal or not (e.g., defective). The test module 200-1 may simultaneously output the first control signal con1, the second control signal con2, and the data signal data, which are stored, to the test module 200-2 in response to the clock signal clk.

The respective test modules 200-2 to 200-*n* operate in the same manner as the test module 200-1 operates, except that they receive the first control signal con1, the data signal data, the second control signal con2, and the clock signal clk from a test module in the previous stage instead of the test apparatus 300.

In an exemplary embodiment, after all of the test modules 200-1 to 200-*n* complete the test operation on their respective DUTs 100-1 to 100-*n*, the test apparatus 300 outputs the second control signal con2, which causes the test modules 200-1 to 200*n* to output error judgment signals val, and the respective test modules 200-1 to 200-*n* output the error judgment signals val in response to the second control signal con2 and the clock signal clk. For example, at the first clock, the error judgment signal val of the test module 200-*n* is input to the test apparatus 300, and the error judgment signal val of the test module 200-(n−1) is stored in the test module 200-*n*. Each of the error judgment signals val of the other test modules 200-1 to 200-(n−2) is stored in a test module in the next stage. In this manner, the error judgment signals val of the respective test modules 200-*n* to 200-1 are consecutively input to the test apparatus 300. Using the error judgment signals val which are consecutively input, the test apparatus 300 can judge whether the DUTs 100-1 to 100-*n* are normal or not (e.g., defective).

For example, since the test board 200 according to an exemplary embodiment includes the test modules, the test apparatus 300 can test a large number of DUTs at one time. Further, when a user wants to test a larger number of DUTs at one time, test modules may be added. For example, additional test modules may be connected in series with prior test modules, without requiring an additional circuit. When the test modules are added, the total test time may increase by a time corresponding to one clock cycle per test module.

Figure 2:
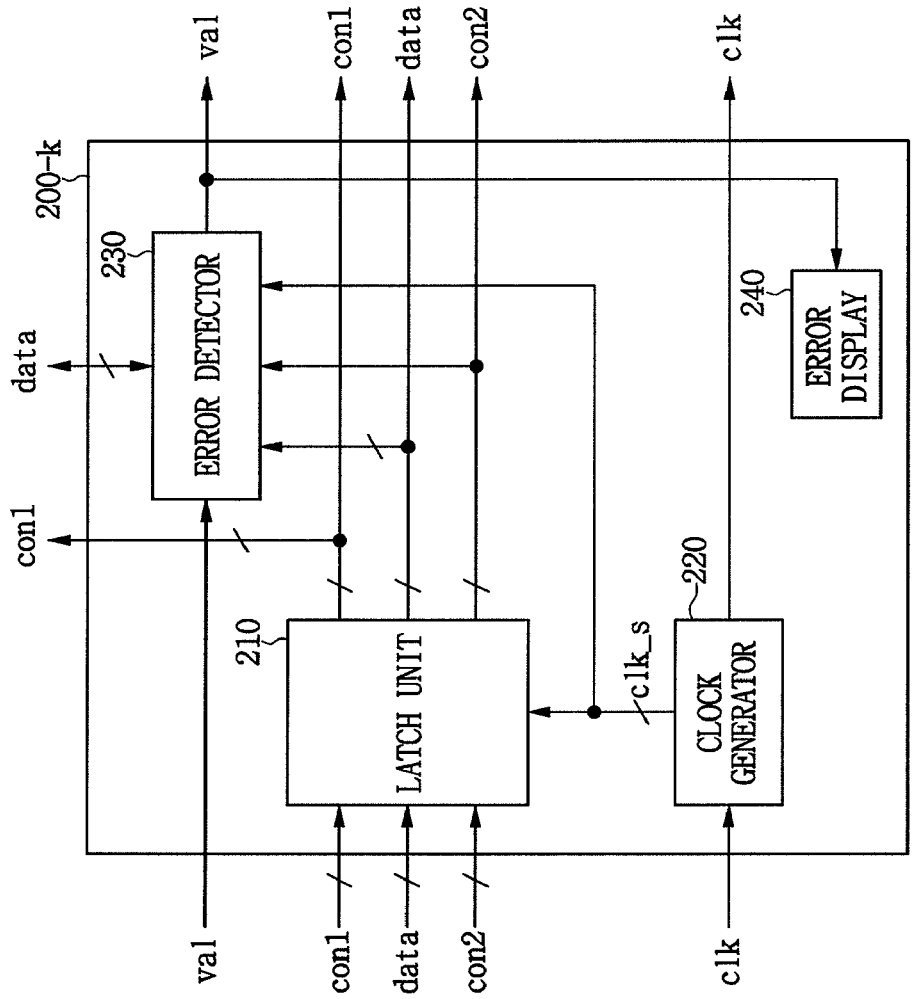
FIG. 2 is a diagram of a test module of the test board according to an exemplary embodiment of the inventive concept.

FIG. 2 is a diagram of a test module 200-*k* of the test board 200 according to an exemplary embodiment of the inventive concept. The test module 200-*k* of the test board 200 may include a latch unit 210, a clock generator 220, and an error detector 230. The test module 200-*k* of the test board 200 may further include an error display 240. The respective test modules 200-1 to 200-*n* may have the same configuration as that of the test module 200-*k* shown in FIG. 2.

The latch unit 210 stores a first control signal con1, a data signal data, and a second control signal con2, which are input in response to an internal clock signal clk_s output from the clock generator 220, and outputs the first control signal con1, the data signal data, and the second control signal con2 which are stored.

The latch unit 210 of the first test module 200-1 receives and stores the first control signal con1, the data signal data, and the second control signal con2, which are output from the test apparatus 300, and each of the other test modules 200-*k* (k represents 2,3, . . . ,n) receives and stores the first control signal con1, the data signal data, and the second control signal con2, which are output from a latch unit 210 of the test module 200-(k−1) in the previous stage.

The first control signal con1 output from the latch unit 210 of the last test module 200-n is input to the DUT 100-n connected to the test module 200-n, and the first control signal con1 output from the latch unit 210 of each of the other test modules 200-k (k represents 1,2, . . . ,(n−1)) is input to a DUT 100-k connected to the test module 200-k and a latch unit 210 of the test module 200-(k+1) in the next stage.

The second control signal con2 and the data signal data output from the latch unit 210 of the last test module 200-n are input to the error detector 230, and the second control signal con2 and the data signal data output from the latch unit 210 of each of the other test modules 200-k (k represents 1, 2, . . . ,(n−1)) is input to the error detector 230 and the latch unit 210 of the test module 200-(k+1) in the next stage.

The clock generator 220 receives a clock signal clk input from the test apparatus 300 and generates an internal clock signal clk_s to output to the latch unit 210 and the error detector 230. For example, the clock generator 220 uses the clock signal clk to generate the internal clock signals clk_s, which transitions in state at necessary timings, and outputs the internal clock signals clk_s to the latch unit 210 and the error detector 230. The error detector 230 may include a latch that latches the internal clock signal clk_s. When testing a semiconductor memory device, the clock generator 220 can output an internal clock signal clk_s such that the state of the internal clock signal transitions at different timings between a read operation and a write operation. The internal clock signal clk_s may be output to a latch which receives, stores, and outputs a data signal data. For example, the clock generator 220 may additionally receive the first control signal con1 and/or the second control signal con2 along with the clock signal clk to generate the internal clock signals clk_s.

The clock generator 220 outputs the clock signal clk to a clock generator 220 of the test module 200-2 in the next stage. As described above, the clock generator 220 need not output the clock signal clk to the clock generator of the test module in the next stage. For example, alternately the test apparatus 300 may directly output the clock signal clk to the clock generators of the test modules 200-1 to 200-n, respectively.

The error detector 230 outputs a data signal data to a DUT 100-k connected to a test module 200-k in response to the second control signal con2, or compares a data signal data output from the DUT 100-k with a data signal data output from the latch unit 210 to judge whether the DUT 100-k is normal or not (e.g., defective) and stores an error judgment signal val indicating the error judgment result.

Further, the error detector 230 outputs the stored error judgment signal val to an error detector of the test module 200-(k+1) in the next stage in response to the second control signal con2 and the internal clock signal clk_s, and receives and stores an error judgment signal val output from the test module 200-(k−1) in the previous stage. The error detector 230 of the first test module 200-1 may receive a signal of logic "0" (or logic "1") instead of the error judgment signal output from the test module in the previous stage, and the error detector 230 of the last test module 200-n outputs the error judgment signal val to the test apparatus 300.

The error display 240 displays whether or not an error has occurred on the DUT 100-k connected to the test module 200-k in response to the error judgment signal val output from the error detector 230. For example, the error display 240 may include an error indicator such as a light emitting diode (LED), which may be turned on and off in response to the error judgment signal val.

As described above, each of the test modules of the test board according to exemplary embodiments shown in FIG. 2 may be implemented on one IC, and can operate individually and independently from one another.

Figure 3:
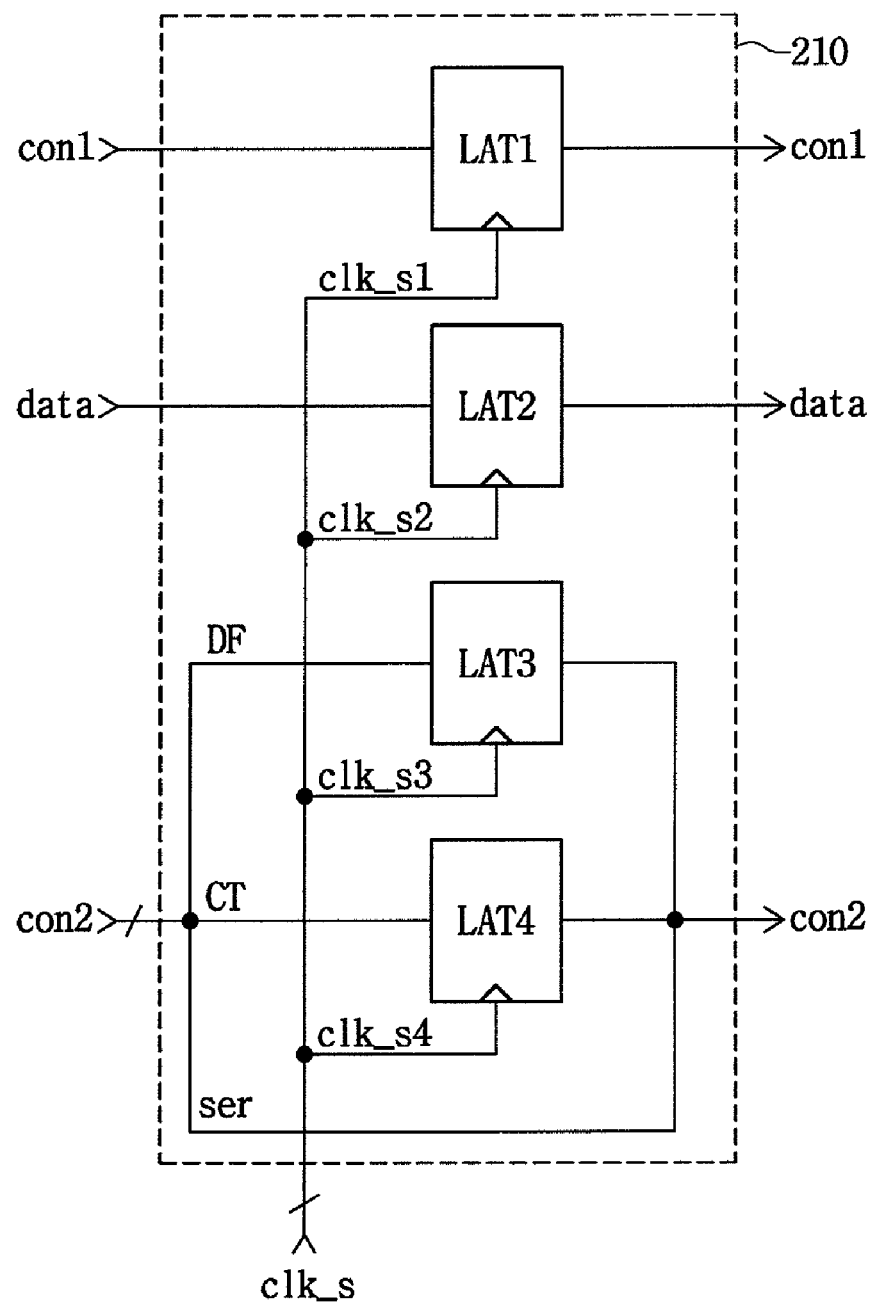
FIG. 3 is a diagram of a latch unit of the test module of the test board shown in FIG. 2 according to an exemplary embodiment of the inventive concept.

FIG. 3 is a diagram of the latch unit 210 of the test module 200-k of the test board 200 according to an exemplary embodiment shown in FIG. 2. The latch unit 210 may include four latches LAT1 to LAT4. However, the latch unit 210 is not limited to including any particular number of latches as the number of the latches LAT1 to LAT4 may be set to one or a plurality depending on the number of signals to be input.

The latches LAT1 to LAT4 respond to internal clock signals clk_s1 to clk_s4, respectively, which are output from the clock generator 220, to receive and store a first control signal con1, a data signal data, and a second control signal con2, respectively, and output the first control signal con1, the data signal data, or the second control signal con2 which are stored, respectively. As described above, the internal clock signals clk_s1 to clk_s4 may be set in such a manner that the states thereof transition at different timings from one another.

As shown in FIG. 3, the second control signal con2 includes a data path control signal DF for controlling whether or not an error detector 230 outputs an input data signal data to a DUT, a comparison timing signal CT for controlling a point of time at which the error detector 230 compares a data signal data input from the DUT with a data signal data stored in the latch unit 210 to judge whether the DUT is normal or not (e.g., defective), and an error output signal ser for controlling whether or not the error detector 230 receives an error judgment signal val of the test module in the previous stage and outputs a stored error judgment signal val to the test module in the next stage. Among the second control signals con2, the error output signal ser may be output without passing through a latch. For example, an error output signal ser output from the test apparatus 300 may be applied to the error detectors 230 of the test modules 200-1 to 200-n at the same time.

Figure 4:
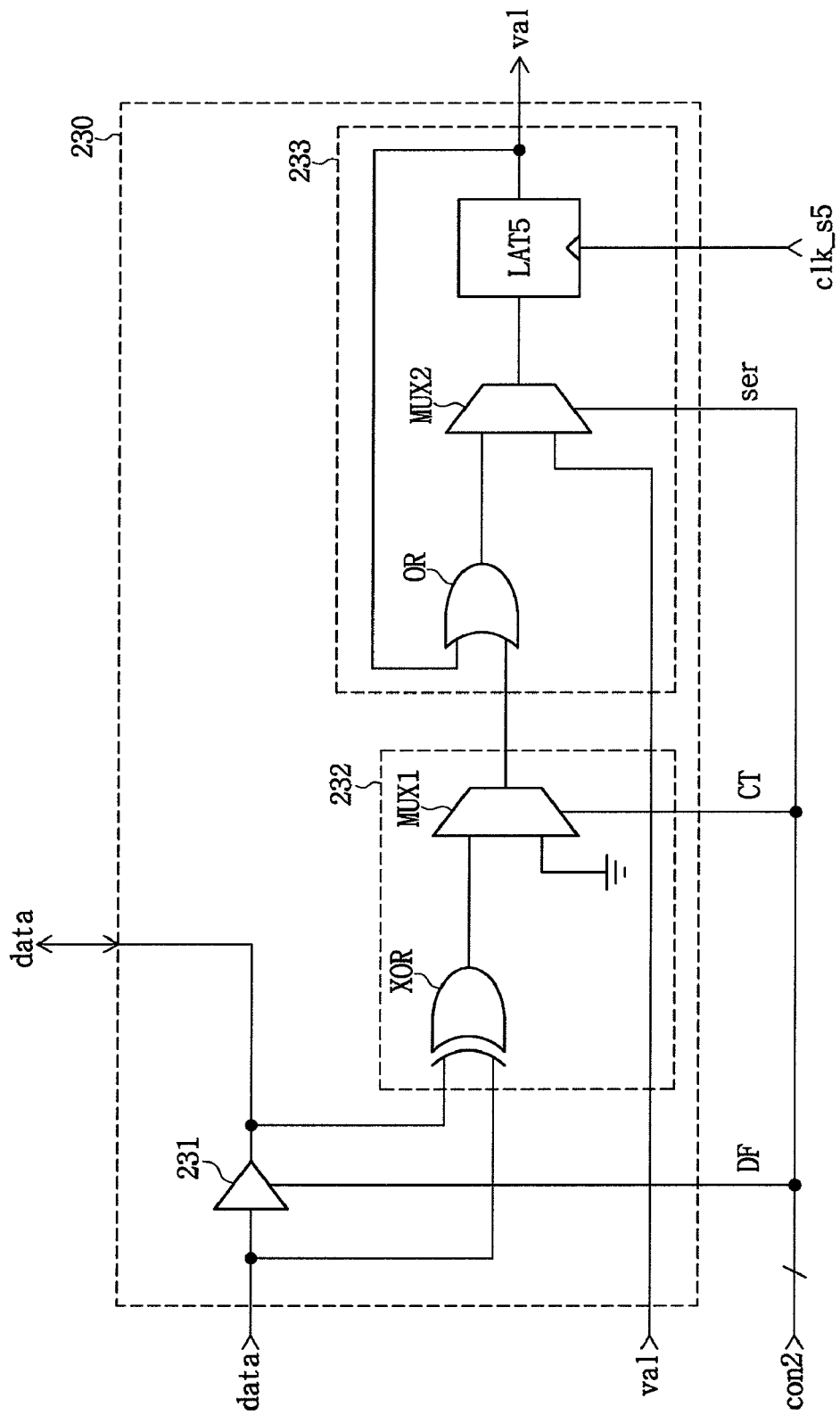
FIG. 4 is a diagram of an error detector of the test module of the test board shown in FIG. 2 according to an exemplary embodiment of the inventive concept.

FIG. 4 is a diagram of an error detector 230 of a test module 200-k of the test board 200 of FIG. 2 according to an exemplary embodiment of the inventive concept. The error detector 230 may include a buffer 231, a comparing section 232, and an error judgment signal storing section 233.

The buffer 231 outputs a data signal data to a DUT in response to the data path control signal DF among the second control signals con2. The data signal data is input from the latch unit 210.

The comparing section 232 compares the data signal data input from the latch unit 210 with a data signal data input from the DUT to judge whether or not an error has occurred, and outputs the judgment result in response to the comparison timing signal CT among the second control signals con2. The comparing section 232 may include an XOR gate XOR and a first multiplexer MUX1. The XOR gate XOR receives the data signal data input from the latch unit 210 and the data signal data input from the DUT to perform an exclusive OR operation (XOR operation), and the first multiplexer MUX1 selects and outputs an output signal of the XOR gate or a signal corresponding to a logic of "0" in response to the comparison timing signal CT.

The error judgment signal storing section 233 selects the output signal of the comparing section 232 or an error judgment signal val output from the error detector 230 of the test module in the previous stage in response to the error output signal ser among the second control signals con2, and stores the selected signal as an error judgment signal val. Further, the error judgment signal storing section 233 outputs the stored error judgment signal val in response to an internal clock signal clk_s5 output from the clock generator 220. The error judgment signal storing section 233 may include an OR gate OR, a second multiplexer MUX2, and an error latch LAT5. The OR gate OR receives the output signal of the comparing section 232 and the error judgment signal val, the second multiplexer MUX2 selects and outputs an output signal of the OR gate OR or an error judgment signal val of the test module in the previous stage in response to the error output signal ser among the second control signals con2, and the error latch LAT5 receives an output signal of the second multiplexer MUX2 in response to the internal clock signal clk_s5 output from the clock generator 220, stores the received signal as an error judgment signal val, and outputs the stored error judgment signal val.

When testing a semiconductor memory device, the test apparatus 300 may output a first control signal con1, which causes the semiconductor memory device to perform a write operation, and the first control signal con1 and a data signal data are consecutively input and stored in the test modules 200-1 to 200-n of the test board 200 in response to a clock signal clk. Further, the stored first control signal con1 and the stored data signal data are input to a DUT 100-k connected to the test module 200-k in response to the clock signal. The latch LAT2 of the latch unit 210 stores the data signal data and outputs the stored data signal data in response to an internal clock signal clk_s2, and the buffer 231 of the error detector 230 outputs the data signal data to the semiconductor memory device as the DUT in response to the data path control signal DF among the second control signals con2. The data signal data is output from the latch unit 210. The semiconductor memory device as the DUT stores the data signal data, which is input in response to the first control signal con1.

Next, the test apparatus 300 may output a first control signal con1, which causes the semiconductor memory device as the DUT to perform a read operation, and the output first control signal con1 is consecutively stored in the test modules 200-1 to 200-n of the test board 200, respectively, in response to a clock signal. Further, the stored first control signal con1 is output to the semiconductor memory device. The semiconductor memory device as the DUT outputs the stored data signal data in response to the first control signal con1.

The comparing section 232 of the error detector 230 compares the data signal data output from the latch unit 210 with the data signal output from the semiconductor memory device as the DUT to judge whether the semiconductor memory device is normal or not (e.g., defective), and outputs the judgment result in response to a comparison timing signal CT. For example, when the data signal data output from the latch unit 210 is identical to the data signal data output from the semiconductor memory device, the XOR gate XOR judges that the semiconductor memory device is normal (e.g., not defective), and outputs a signal of logic "0." When the data signal data output form the latch unit 210 is different from the data signal data output from the semiconductor memory device, the XOR gate XOR judges that the semiconductor memory device is abnormal (e.g., defective), and outputs a signal of logic "1." The first multiplexer MUX1 selects and outputs the output signal of the XOR gate XOR at a point of time in which the data signal data stored in the latch unit 210 and the data signal data read from the semiconductor memory device are input to the XOR gate XOR in response to the comparison timing signal CT.

The OR gate OR performs an OR operation on the signal output from the comparing section 232 and the error judgment signal val, and then outputs the operation result. Further, the second multiplexer MUX2 selects and outputs the output signal of the OR gate OR in response to an error output signal ser until the test is completed for all the DUTs. When the test is completed for all the DUTs, the second multiplexer MUX2 selects and outputs an error judgment signal val output from the test module in the previous stage.

When a variety of operations are consecutively tested for a DUT, and if it is judged from one operation among the variety of operations that the DUT is abnormal (e.g., defective), the comparing section 232 outputs a signal of logic "1" indicating that the DUT is abnormal (e.g., defective). The signal may be stored in the error latch LAT5. When it is judged from one operation among the variety of tested operations that the DUT is abnormal (e.g., defective), an error judgment signal val of logic "1" is stored in the error latch LAT5, the error judgment signal val of logic "1" indicating that the DUT is abnormal (e.g., defective).

When the test is completed for all the DUTs, the second multiplexer MUX2 outputs the error judgment signal val output from the test module in the previous stage, and the error latch LAT5 outputs the stored error judgment signal val in response to the internal clock signal clk_s5, and receives and stores the error judgment signal val output from the second multiplexer MUX2, the error judgment signal being output from the test module in the previous stage. When the test is completed for all the DUTs, each of the error judgment signals val stored in the error detectors 230 of the test modules 200-1 to 200-n is consecutively stored in the error detector 230 of the test module in the next stage, and the error judgment signal stored in the last test module 200-n to the error judgment signal stored in the first test module 200-1 are consecutively input to the test apparatus 300.

While the testing of a semiconductor memory device has been described above, a test board and a test system according to exemplary embodiment can also be applied when a general semiconductor device is tested.

In a test board having a plurality of test modules and a test system having the same according to an exemplary embodiment, as the test board having the test modules is connected to the test apparatus, the test apparatus operates in the same manner by using the same number of channels as it tests one DUT. Simultaneously, the test apparatus can test a large number of DUTs. Further, each of the test modules can be implemented as one IC, which can operate individually and independently. Further, as the test modules are additionally connected, the number of DUTs which are to be tested simultaneously may be increased. When the test modules are added, the test modules may be connected in series without a circuit change of the test board. Moreover, even when the test modules are added to increase the number of DUTs tested at the same time, the total test time may not increase significantly.

According to at least one exemplary embodiment of the inventive concept, in a test board having a plurality of test modules and a test system including the same, the test board includes a plurality of test modules which are connected in series, and thus a large number of semiconductor devices may be tested at one time using a small number of channels.

Having described exemplary embodiments of the inventive concept, it will be understood that the invention is not limited to the disclosed embodiments, but, on the contrary, is intended to cover various modifications and equivalent arrangements included within the spirit and scope of the disclosure.

What is claimed is:

1. A test board, wherein the test board comprises:
a plurality of test modules,
wherein each test module is configured to store a first control signal, a data signal, and a second control signal in response to a clock signal,
wherein each test module is configured to test a corresponding device under test (DUT) using the first control signal and the data signal in response to the second control signal to generate an error judgment signal indicating whether the DUT is defective,
wherein each test module is configured to output the first control signal, the data signal, and the second control signal to a test module in a next stage,
wherein each test module of a subsequent stage is configured to receive the error judgment signal generated by a test module in a previous stage in response to the clock signal,
wherein each test module comprises:
a clock generator configured to output an internal clock signal in response to the clock signal; and
a latch unit configured to receive and store the first control signal, the data signal, and the second control signal in response to the internal clock signal, and output the first control signal, the data signal, and the second control signal which are stored therein.

2. The test board according to claim 1, wherein each test module of a subsequent stage receives the error judgment signal generated by a test module in a previous stage in response to the clock signal when all the tests of the test modules have completed.

3. The test board according to claim 1, wherein the plurality of test modules are connected in series with one another and the last test module of the series outputs the error judgment signal to the test board.

4. The test board according to claim 1, wherein each test module further comprises:
an error detector configured to output the data signal output from the latch unit to the corresponding DUT in response to the second control signal, compare a data signal output from the DUT with the data signal output from the latch unit in response to the internal clock signal and the second control signal to generate a comparison result indicating whether the DUT is defective, and output the error judgment signal based on the comparison result.

5. The test board according to claim 4, wherein each test module further comprises an error display configured to display whether the corresponding DUT is defective in response to the error judgment signal.

6. The test board according to claim 4,
wherein the clock generator outputs first to fourth internal clock signals in response to the clock signal,
wherein the second control signal includes a data path control signal, a comparison timing signal, and an error output signal,
wherein the latch unit comprises:
a first latch configured to receive and store the first control signal in response to the first internal clock signal, and output the stored first control signal to the corresponding DUT and the test module in the next stage;
a second latch configured to receive and store the data signal in response to the second internal clock signal, and output the stored data signal to the error detector and the test module in the next stage;
a third latch configured to receive and store the data path control signal in response to the third internal clock signal, and output the stored data path control signal to the error detector and the test module in the next stage; and
a fourth latch configured to receive and store the comparison timing signal in response to the fourth internal clock signal, and output the stored comparison timing signal to the error detector and the test module in the next stage, and
wherein the error output signal is applied to the error detector and the test module in the next stage without passing through a latch.

7. The test board according to claim 6, wherein the error detector comprises:
a buffer configured to output the data signal output from the second latch to the corresponding DUT in response to the data path control signal;
a comparing section configured to compare the data signal output from the second latch with a data signal output from the DUT to determine whether the DUT is defective, and output the comparison result in response to the comparison timing signal; and
an error storing section configured to receive and store the output signal of the comparing section or the error judgment signal of the test module in the previous stage in response to the error output signal, and output the stored signal as the error judgment signal.

8. The test board according to claim 7, wherein the comparing section comprises:
an exclusive OX (XOR) gate configured to receive the data signal output from the second latch and the data signal output from the corresponding DUT to perform an XOR operation; and
a first multiplexer configured to select and output one signal between a signal of logic "0" and an output signal of the XOR gate in response to the comparison timing signal.

9. The test board according to claim 7,
wherein the clock generator additionally outputs a fifth internal clock signal in response to the clock signal, and
wherein the error storing section comprises:
an OR gate configured to perform an OR operation on the output signal of the comparing section and the error judgment signal to output the operation result;
a second multiplexer configured to select and output one signal between the output signal of the OR gate in response to the error output signal and the error judgment signal output from the test module in the previous stage; and
an error latch configured to receive and store the output signal of the second multiplexer in response to the fifth internal clock signal, and output the stored signal as the error judgment signal.

10. A test system comprising:
a test apparatus configured to output a first control signal, a data signal, a second control signal, and a clock signal; and
a test board having a plurality of test modules,
wherein each test module is configured to receive and store a first control signal, a data signal, and a second control signal in response to a clock signal, test a corresponding device under test (DUT) using the stored first control signal and the stored data signal in response to the stored second control signal to store an error judgment signal indicating whether the DUT is defective, wherein each test module is configured to output the first control signal, the data signal, and the second control signal, which are stored therein, to a test module in a next stage, and receive and store the error judgment signal output from a test module in a previous stage in response to the clock signal when all of the tests of the test modules have completed, wherein the first test module of the test modules is configured to receive the first control signal, the data signal, the second control signal, and the clock signal output from the test apparatus, and the last test module of the test modules is configured to output the error judgment signal to the test apparatus, and wherein each test module comprises:
   a clock generator configured to output an internal clock signal in response to the clock signal;
   a latch unit configured to receive and store the first control signal, the data signal, and the second control signal in response to the internal clock signal, and output the first control signal, the data signal, and the second control signal which are stored therein.

11. The test system according to claim 10, wherein the plurality of test modules are connected in series with one another.

12. The test system according to claim 10, wherein each test module further comprises:
   an error detector configured to output the data signal output from the latch unit to the corresponding DUT in response to the second control signal, compare a data signal output from the DUT with the data signal output from the latch unit in response to the internal clock signal and the second control signal to generate a comparison result indicating whether the DUT is defective, and store and output the error judgment signal based on the comparison result.

13. The test system according to claim 12, wherein each test module further comprises an error display configured to display whether the corresponding DUT is defective in response to the error judgment signal.

14. A test system, wherein the test system comprises:
   a test apparatus configured to output a first control signal, a second control signal, a data signal, and a clock signal; and
   a test board having a plurality of test modules,
   wherein each test module is configured to interface with and test a different device under test (DUT),
   wherein each test module is configured to store the first control signal, the second control signal, and the data signal in response to the clock signal and test a corresponding DUT using the data signal and the first control signal in response to the second control signal to generate an error signal indicating whether the DUT is defective,
   wherein the test board is configured to sequentially output the error signals to the test apparatus based on a state of the second control signal,
   wherein at least one of the test modules comprises an error detector, wherein the error detector comprises:
      an exclusive OR (XOR) gate configured to receive the stored data signal and a data signal output from a corresponding DUT to perform an XOR operation; and
      a multiplexer configured to select and output one of a predefined logic level and an output signal of the XOR gate in response to the second control signal.

15. The test system according to claim 14, wherein the test board is configured such that either the clock signal is output from the test apparatus to each of the test modules or the clock signal is output from the test apparatus only to the first test module and each subsequent test module receives the clock signal from a prior test module.

16. The test system according to claim 14, wherein the plurality of test modules are connected in series with one another, and the test board sequentially output the error signals via the last test module.

17. The test system according to claim 16, wherein at least one of the test modules includes a multiplexor that receives a result of the test and the error signal of a preceding test module and outputs one of the result or the error signal to a subsequent test module based on the second control signal.

18. The test system according to claim 16, wherein at least one of the test modules comprises:
   a clock generator configured to output an internal clock signal in response to the clock signal;
   a latch unit configured to store the first control signal, the data signal, and the second control signal in response to the internal clock signal; and
   the error detector, wherein the error detector is configured to output the data signal output from the latch unit to the corresponding DUT in response to the second control signal, compare the data signal output from the DUT with the data signal output from the latch unit in response to the internal clock signal and the second control signal to generate a comparison result indicating whether the DUT is defective, and output the error signal based on the comparison result.

19. The test system according to claim 18, wherein the error detector comprises:
   a buffer configured to output the data signal output from the latch unit to the corresponding DUT in response to the second control signal;
   a comparing section configured to compare the data signal output from the latch unit with the data signal output from the DUT to determine whether the DUT is defective, and output the comparison result in response to the second control signal; and
   an error storing section configured to receive and store the output signal of the comparing section or the error signal of the test module of the previous stage in response to the second control signal.

20. The test board of claim 1, wherein the clock generator is configured to adjust a state of the internal clock signal to transition at different timings between a read operation and a write operation.

* * * * *